United States Patent
Chu et al.

(10) Patent No.: US 6,643,128 B2
(45) Date of Patent: Nov. 4, 2003

(54) METHOD AND SYSTEM FOR CONTROLLING A COOLING FAN WITHIN A COMPUTER SYSTEM

(75) Inventors: Herman W. Chu, Palo Alto, CA (US); Eugene Chung, San Jose, CA (US); Robert J. Thomas, San Jose, CA (US); Myron R. Tuttle, Santa Clara, CA (US); Samuel M. S. Lee, San Jose, CA (US)

(73) Assignee: Hewlett-Packard Development Company, LP., Houston, TX (US)

( * ) Notice: Subject to any disclaimer, the term of this patent is extended or adjusted under 35 U.S.C. 154(b) by 29 days.

(21) Appl. No.: 09/904,928

(22) Filed: Jul. 13, 2001

(65) Prior Publication Data

US 2003/0011984 A1 Jan. 16, 2003

(51) Int. Cl.⁷ .................................................. G06F 1/16
(52) U.S. Cl. .................... 361/687; 361/695; 318/471
(58) Field of Search .............................. 318/471, 474; 361/694–695, 687

(56) References Cited

U.S. PATENT DOCUMENTS

| | | | |
|---|---|---|---|
| 5,287,244 A | | 2/1994 | Hileman et al. |
| 5,513,361 A | * | 4/1996 | Young .......................... 713/320 |
| 5,687,079 A | | 11/1997 | Bauer et al. |
| 5,848,282 A | | 12/1998 | Kang |
| 5,926,386 A | | 7/1999 | Ott et al. |
| 5,929,581 A | | 7/1999 | Van Brocklin et al. |
| 5,986,883 A | | 11/1999 | Johnson et al. |
| 6,094,345 A | | 7/2000 | Diemunsch |
| 6,101,459 A | | 8/2000 | Tavallaei et al. |
| 6,141,213 A | | 10/2000 | Antonuccio et al. |
| 6,182,232 B1 | | 1/2001 | Klein |
| 6,198,245 B1 | * | 3/2001 | Du et al. ........................ 318/471 |
| 6,285,150 B1 | * | 9/2001 | Adam et al. ................... 318/471 |
| 6,336,080 B1 | * | 1/2002 | Atkinson ....................... 702/132 |
| 6,340,874 B1 | * | 1/2002 | Vladimir ....................... 318/471 |
| 6,349,385 B1 | * | 2/2002 | Kaminski et al. ............ 713/300 |
| 6,380,704 B1 | * | 4/2002 | Chin ............................. 318/268 |

* cited by examiner

*Primary Examiner*—Darren Schuberg
*Assistant Examiner*—Anthony Q. Edwards

(57) ABSTRACT

A method and system of controlling a cooling fan of a computer system including a power supply unit. The method includes sensing a power load of the power supply unit. A reference air temperature of the computer system is also sensed. Finally, a fan setting is determined based upon the sensed power load and the sensed reference air temperature. By basing the fan setting on both reference temperature and actual power supply load, the method and system effectively minimizes cooling fan operation, and thus resulting acoustic noise, when a computer system is operating at less than full capacity. In one preferred embodiment, a look-up table is provided in which a plurality of fan settings are included, each fan setting being based upon a correlation of power supply load and reference temperature. The method and system of the present invention is particularly useful with high-end, server-type computer systems being used for low-end applications, and is readily applied to multiple platforms.

20 Claims, 4 Drawing Sheets

| 51-100% of Maximum Design Power Load (High) | | | Below 51% of Maximum Design Power Load (Low) | | |
|---|---|---|---|---|---|
| Sensor Temperature (°C) | Fan Voltage (V) | Acoustic Signature (dBA) | Sensor Temperature (°C) | Fan Voltage (V) | Acoustic Signature (dBA) |
| 32 or above | 12 | 61 | 34 or above | 12 | 61 |
| 28-31 | 10 | 57 | 31-33 | 10 | 57 |
| 23-27 | 8 | 50 | 26-30 | 8 | 50 |
| 22 or below | 6 | 45 | 25 or below | 6 | 45 |

*Fig. 4*

| | |
|---|---|
| LOW TEMPERATURE LOW POWER SUPPLY LOAD<br><br>FAN SETTING=6 VOLTS | LOW TEMPERATURE HIGH POWER SUPPLY LOAD<br><br>FAN SETTING=10 VOLTS |
| HIGH TEMPERATURE LOW POWER SUPPLY LOAD<br><br>FAN SETTING=8 VOLTS | HIGH TEMPERATURE HIGH POWER SUPPLY LOAD<br><br>FAN SETTING=12 VOLTS |

*Fig. 5*

METHOD AND SYSTEM FOR CONTROLLING A COOLING FAN WITHIN A COMPUTER SYSTEM

BACKGROUND OF THE INVENTION

The present invention relates to a method and system for operating a cooling fan within a computer system. More particularly, it relates to controlling cooling fan speed based upon power supply load and temperature for improved acoustic performance.

Computers or computer systems are extremely prevalent in today's society, and are configured for a wide variety of applications. To this end, computer systems have traditionally been categorized as either low-end or high-end, based upon hardware capabilities and user application. For example, low-end computer systems typically refer to personal computers or desktop computers, utilized for relatively standard applications, such as word processing, spread sheet applications, internet navigation, etc. Low-end computers are commonly used in an office environment, in close proximity to one or more office occupants. Conversely, high-end computer system include network servers and advanced standalone computers having processor capabilities able to operate complex programs such as finite element analysis, CAD applications, etc. For most business applications, these high-end computer systems are typically located in a separate room (e.g., a server room) as a separate workstation area.

Regardless of the end application, the electronic hardware, including processor(s), power supply unit(s), etc., associated with a computer system generates heat. Heat is typically removed from the computer system by one or more cooling fans mounted in close proximity to the heat producing and/or heat sensitive components. Though performing a highly important function, the cooling fan(s) generates acoustic noise. For a computer system requiring a relatively large cooling fan, this noise can become quite loud.

The above-described fan-related acoustic noise problem has heretofore been relatively limited due to the work environments in which the particular computer system is placed. That is to say, low-end computer systems, although normally positioned in close proximity to one or more users, typically utilize a relatively small cooling fan due to the relatively small number and size of internal components. As a result, the acoustical noise generated by the low-end computer system cooling fan is virtually negligible. In contrast, while high-end computer systems entail large cooling fans, and thus elevated acoustical noise levels, these computer systems are normally positioned in remote computer rooms or areas that are separate from office occupants. As such, the acoustic noise associated with high-end computer systems did not cause user discomfort as the user(s) were not stationed in close proximity to the computer.

The continued advancement of the computer hardware technology has blurred the distinction between high-end and low-end computer systems. In particular, the hardware components associated with server-type computer systems has improved to the point that server technology can be implemented in less expensive and smaller platforms. As a result, the end-users are increasingly more inclined to use these high performance computers, otherwise adapted for network applications, as high-end personal computers in the ordinary work environment. In light of the above-described acoustic noise levels generated by these high performance, server-type computer systems, the opportunity for user discomfort increases dramatically as the user is now sitting in close proximity to the computer system. Further exacerbating this concern is the fact that processor advancements entail more closely packed conductors, necessitating use of even larger cooling fans and constricted, and thus even more acoustic noise.

Most conventional cooling fans associated with computer systems are run at a constant voltage. The fans and their operating voltages are selected so that adequate air flow/cooling is guaranteed for a computer system's worst case cooling needs and ambient temperature conditions. The cooling fan automatically runs at a maximum speed, so that regardless of the actual heat generation, sufficient cooling is always provided. Often times, sufficient cooling can be achieved with much less air flow. Under these conditions, this means providing more air flow, and thus more acoustic noise, than is needed. Some cooling fans do provide a means of ramping up fan speed as a function of changes in ambient temperature conditions. However, the cooling fans are still configured so as to always assume a worst case of operating conditions (or maximum heat generation). Thus, even where the heat could adequately be removed at a lower speed, a cooling fan's thermal ramp will begin at a relatively high speed, such that the airflow and acoustic noise produced by the fan are still significantly greater than otherwise required.

Pointedly, where a high-end computer system, otherwise designed for high performance activities such as network applications, is being used for low-end applications as described above, the cooling requirements are significantly lower than the worse case scenario. In general terms, the various internal components (e.g., processor) are operating/processing at lower than maximum speeds, drawing less power, and thus generate lesser amounts of heat. Unfortunately, because current fan control methodologies rely solely on ambient temperature to determine an appropriate fan setting, the cooling fan speed, and thus the acoustic noise, will always be higher than is otherwise necessary. It may be possible to provide two separate cooling fan control systems within a single computer, one for each type of end application (i.e., high-end and low-end). From a cost standpoint, this solution is not practical. A related concern arises in the context of computer manufacturer's practice of simultaneously designing and developing multiple computer platforms utilizing the same basic component/chassis layout (e.g., a high-end platform and a low-end platform). The chassis and majority of hardware components are virtually identical for each platform; however, other components, for example the motherboard, are different. In the past, it has been necessary to design and provide a different cooling scheme for each platform, due to the vast difference in generated heat during use (e.g., the high-end platform motherboard can generate more heat than the low-end platform motherboard). Obviously, this entails additional costs and design time.

Computer system technology continues to evolve. The resulting increase in processing capabilities with a related decrease in size and cost has resulted in utilization of high-end computer systems in standard workplace environments, and thus in close proximity to users. Oftentimes, the computer system is being operated at less than full capacity, such that the fan speed and resultant acoustic noise is unnecessarily high. Therefore, a need exists for method and system of controlling a computer cooling fan relative to power supply load.

SUMMARY OF THE INVENTION

One aspect of the present invention relates to a method of controlling a cooling fan of electronic equipment including a power supply unit. The method includes sensing a power load of the power supply unit. A reference temperature of the electronic equipment is also sensed. Finally, a fan setting is determined based upon the sensed power load and the sensed reference temperature. By basing the fan setting on both reference air temperature and actual power supply lead, the method effectively minimizes cooling fan operation, and thus resulting acoustic noise, when the electronic equipment is operating at less than full capacity. In one preferred embodiment, a look-up table is provided in which a plurality of fan settings are included, each fan setting being based upon a correlation of power supply load and reference temperature. In another preferred embodiment, the electronic equipment is a computer system.

Another aspect of the invention relates to a method of controlling a computer system operating under normal conditions. The computer system includes a chassis maintaining a power supply unit, a temperature sensor, a central processing unit, and a cooling fan. In this regard, the cooling fan is rated to have a maximum operational speed that provides sufficient air flow/cooling when the power supply unit is operating at a maximum available power load. With this in mind, the method includes sensing a power load of the power supply unit. A reference air temperature of the computer system is sensed via the temperature sensor. Finally, the cooling fan is operated at less than the maximum operational speed when the sensed power load is less than a predetermined value and the sensed reference air temperature is less than a predetermined value. With this methodology, a high-end computer can readily be used in an office environment with minimal acoustic noise-related user aggravation, as the cooling fan is effectively prevented from running at a higher than necessary speed. In one preferred embodiment, the sensed power load is categorized relative the maximum available power load as either a high load or a low load. With this one preferred embodiment, where the sensed power load is designated as a low load, the cooling fan is operated at a lesser speed as compared to a speed at the same ambient temperature but high load.

Yet another aspect of the present invention relates to a computer system including a chassis, a central processing unit, a cooling fan, a temperature sensor, a power supply unit, a power load sensor, and a control device. The central processing unit is disposed within the chassis. The cooling fan is associated with the chassis. The temperature sensor is provided to sense a temperature of ambient air at the chassis. The power supply unit is coupled to the chassis for powering the central processing unit. The power load sensor is provided to sense a power load on the power supply unit. Finally, the control device is provided to control a speed of the fan. In this regard, the control device operates the cooling fan as a function of the sensed ambient air temperature and the sensed power load. With this construction, the control device effectively limits audible fan noise to a minimum.

BRIEF DESCRIPTION OF THE DRAWINGS

FIG. 4 is a an exemplary look-up table useful with the method and system of the present invention; and FIG. 5 is another exemplary look-up table useful with the method and system of the present invention.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
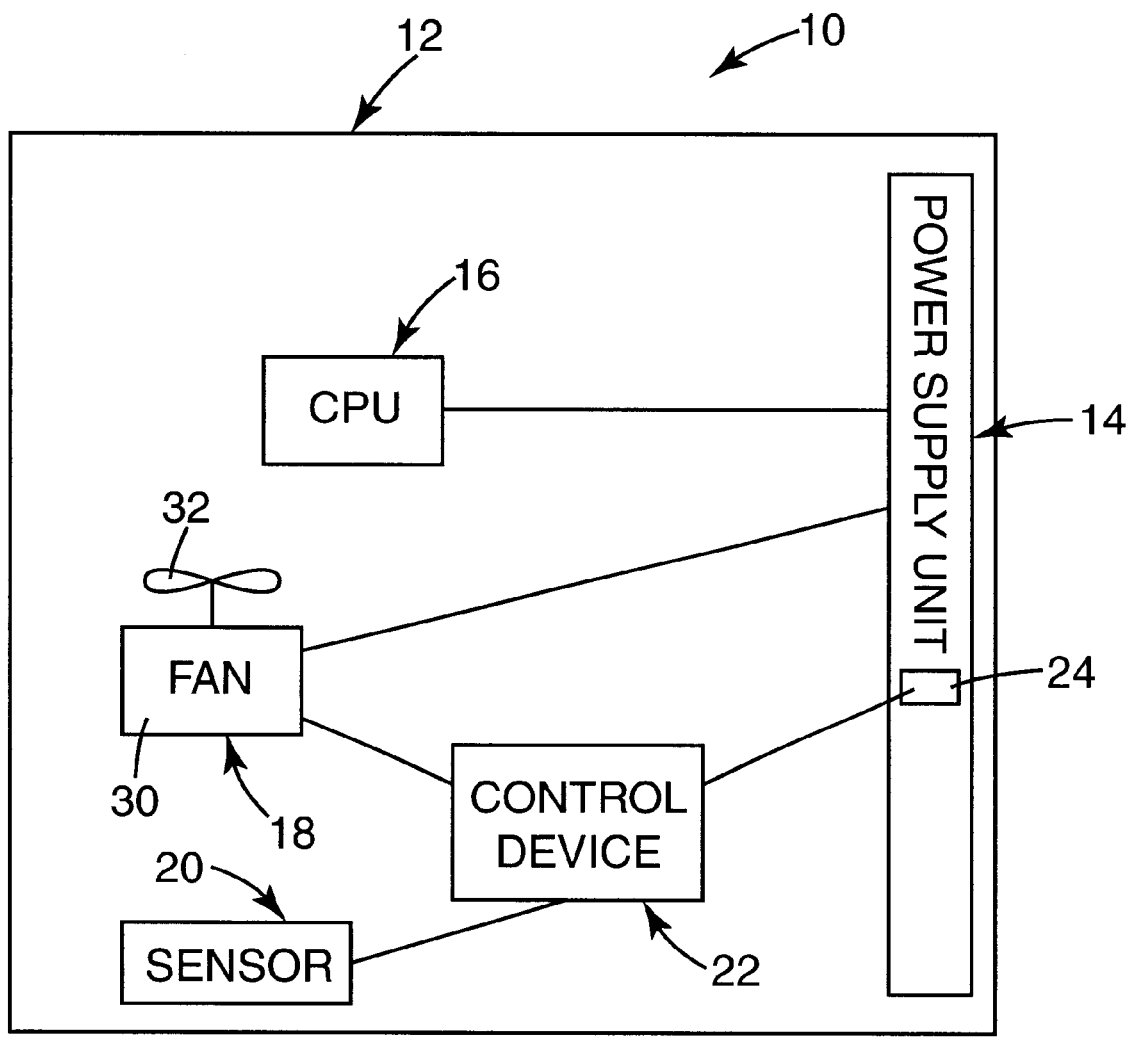
FIG. 1 is diagrammatic illustration of a computer system incorporating a cooling fan control device in accordance with the present invention.

FIG. 1 illustrates in block form a computer system 10 that implements one embodiment of the present invention. As a point of reference, the computer system 10 is shown by way of example and not of limitation. Many different types of computer systems or other microprocessor-based devices can benefit from the present invention. Even further, the present invention is not limited to a computer system, but instead is applicable to any electronic equipment requiring internal cooling via a controlled cooling fan. In a preferred embodiment, however, the computer system 10 is a high-end computer, more preferably a server-type computer, capable of high-speed processing.

With the above in mind, the computer system 10 typically includes a chassis or housing 12, a power supply unit 14, a central processing unit (CPU) or microprocessor 16, a cooling fan 18, a temperature sensor 20, and a control device 22. The various components are described in greater detail below. In general terms, however, the components 14–22 are maintained within the chassis 12. The power supply unit 14 supplies power to the CPU 16 and the cooling fan 18. The cooling fan 18, in turn, directs air flow over the CPU 16 (and/or other components) during use. Finally, the control device 22 controls operation of the cooling fan 18 based upon information from the power supply unit 14 and the temperature sensor 20.

As is known in the art, the power supply unit 14 receives an externally applied AC (alternating current) voltage and supplies differing DC (direct current) voltages to a variety of components, including the CPU 16 and the cooling fan 18. Alternatively, the power supply unit 14 can be configured to receive a DC voltage. Regardless, the various components electrically connected to the power supply unit 14 place a load on the power supply unit 14 during use. To this end, the power supply unit 14 must be capable of powering all requisite components of the computer system 10, including not only the CPU 16 and the cooling fan 18, but also numerous additional components not otherwise illustrated (e.g., hard drive, CD-ROM drive, auxiliary controllers, memory modules, etc.). During manufacture, therefore, the power supply unit 14 is selected to have a maximum power load capability sufficient to simultaneously satisfy the maximum power requirement needs of all powered components. Alternatively, additional power supply units can be provided.

The present invention makes use of a load on the power supply unit 14 to select an appropriate cooling fan setting. As such, a parameter indicative of the power supply unit 14 load can be monitored or sensed by a load sensor (illustrated generally at 24 in FIG. 1). For example, the AC input power to the power supply unit 14 can be sensed and is indicative of a load of the power supply unit 14. In one particular embodiment, a measurement of the AC input voltage to the power supply unit 14 is provided to the control device 22, and the input current to the power supply unit 14 is sensed (for example, by the load sensor 24). The product of these values approximates the input power to the power supply unit 14, and thus the power supply load. Conversely, a load of the power supply unit 14 can be based upon the output power of the power supply unit 14. For example, the output current from the power supply unit 14 can be sensed (via, for example, the load sensor 24) and signaled to the control device 22. Because the output voltage of the power supply unit 14 is known, the output power, and thus the power load, of the power supply unit 14 can be determined. To this end, it is known that available power supply units generate an internal current signal that is proportional to the load on the power supply unit; this internal signal can be provided to the control device 22 for estimating power supply load. Other known techniques for determining or estimating load are also acceptable.

The CPU 16 is also of a type commonly known in the art. In a preferred embodiment, the CPU 16 is a high-end microprocessor capable of performing network server operations. Notably, the computer system 10 can be designed as a multiprocessor (MP), such that two or more of the CPUs 16 are provided. Regardless, the CPU 16 generates heat during use; the amount of generated heat increasing as the CPU 16 is required to perform more and/or faster operations, thereby placing a larger load on the power supply unit 14. Notably, while the CPU 16 is illustrated as being connected directly to the power supply unit 14, intermediate power conversion component(s) (e.g., voltage regulator modulator) can additionally be provided, as is known in the art.

The cooling fan 18 is of a type known in the art and generally includes a motor 30 and a fan blade 32. The motor 30 operates with a DC voltage from the power supply unit 14. The speed (or rotation of the blade 32) of the cooling fan 18 depends upon the voltage level provided to the motor 30. Thus, the fan speed increases with an increase in supplied voltage. In a preferred embodiment, the cooling fan 18 is rated to have a maximum speed at a voltage level of 12 volts, a minimal operational rate at a supply voltage of 6 volts. Of course, other configurations are equally acceptable. Also, additional cooling fans 18 can be provided and strategically positioned to cool other components of the computer system 10.

The temperature sensor 20 is of a type known in the art and is configured to sense a reference temperature of the computer system 10. In one preferred embodiment, the temperature sensor 20 is configured and positioned to sense a critical ambient air temperature of air at the chassis 12 (e.g., within or entering the chassis 12). Alternatively, the temperature sensor 20 can be positioned elsewhere within the chassis 12 such as adjacent to or in contact with the CPU 16 or other internal component. Regardless, the temperature sensor 20 provides information indicative of a critical temperature parameter of the computer system 10.

Finally, the control device 22 is preferably a programmable controller configured to control operation of the cooling fan 18, and in particular the motor 30, based upon information provided from the power supply unit 14 and the temperature sensor 20. In general terms, the control device 22 includes circuitry (for example a thermistor) formatted to evaluate the load of the power supply unit 14 and the reference temperature provided by the temperature sensor 20, and determine a preferred operational setting or rate of the cooling fan 18. Based upon this evaluation, the control device 22 initiates or regulates the voltage applied to the cooling fan 18 from the power supply unit 14 to a corresponding level. To this end, the control device 22 can store or otherwise be programmed, via appropriate firmware for example, to include a look-up table having preferred fan setting values for different sensed temperatures and power supply loads, to operate algorithms for determining a preferred fan setting based upon sensed temperature and power supply load, etc. Preferred look-up tables are described in greater detail below.

Figure 2:
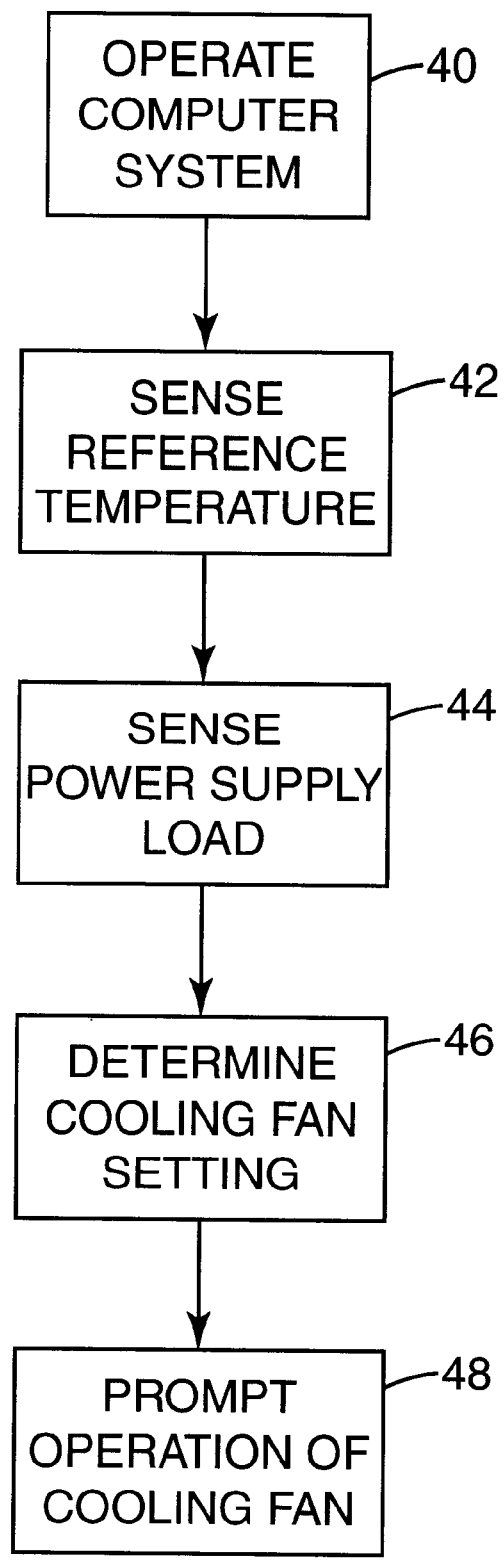
FIG. 2 is a flow diagram illustrating a method of controlling a cooling fan in accordance with the present invention.

One method of controlling operation of the cooling fan 18 in accordance with the present invention is illustrated by the flow diagram of FIG. 2. Beginning at step 40, the computer system 10 operates under normal conditions. That is to say, the computer system 10 is actually being used by a user, and is not in a reduced power consumption mode (e.g., a stand-by mode, a sleep mode, a suspend mode, etc.). During operation of the computer system 10, a critical temperature is sensed at step 42. In particular, with reference to the one embodiment of FIG. 1, the control device 22 receives information from the temperature sensor 20. Once again, the sensed temperature can be ambient air temperature entering or within the chassis 12, a temperature at specific component such as the CPU 16, etc. Regardless, the load of the power supply unit 14 is sensed at step 44. For example, the input current (either AC or DC) or DC output current of the power supply unit 14 is sensed via the load sensor 24 as previously described.

With the sensed temperature and power supply load values in hand, the control device 22 determines a setting for the cooling fan 18 at step 46. Unlike conventional control schemes that rely solely upon temperature, the cooling fan setting selected in accordance with the present invention is a function of both temperature and power supply load. More particularly, the determined cooling fan setting accounts for the computer system 10 possibly operating at less than full capacity, and thus requiring less air flow to achieve sufficient cooling. For example, where the computer system 10 is a high-end, server-type computer being used to do simple word processing, the various internal components are operating at less than full capacity and thus generating less than a maximum amount of heat. Depending upon the sensed ambient temperature, the method and system of the present invention may determine that the cooling fan 18 can be operated at a lower speed as compared to maximum cooling needs. As a result, less acoustic noise is generated. As previously described, this determination can be made with reference to a look-up table, algorithms, etc.

Finally, at step 48, the control device 22 prompts operation of the cooling fan 18 in accordance with the determined fan setting. For example, the fan setting can be a voltage level applied to the motor 30. Notably, other control features and/or functions can be incorporated into the system and method of the present invention. For example, one or more additional temperature sensors can be provided within the chassis 12, signaling internal chassis temperature information to the control device 22. In one preferred embodiment, a temperature sensor is provided at, or integrally formed within, the CPU 16. The control device 22 receives this information, and is programmed to store a predetermined CPU maximum temperature limit. If it is determined that the actual CPU 16 temperature exceeds this maximum limit, the various cooling fan control steps are overridden, and the cooling fan 18 is prompted to operate at its highest setting/rate until the CPU 16 temperature drops below the maximum limit.

Figure 3:
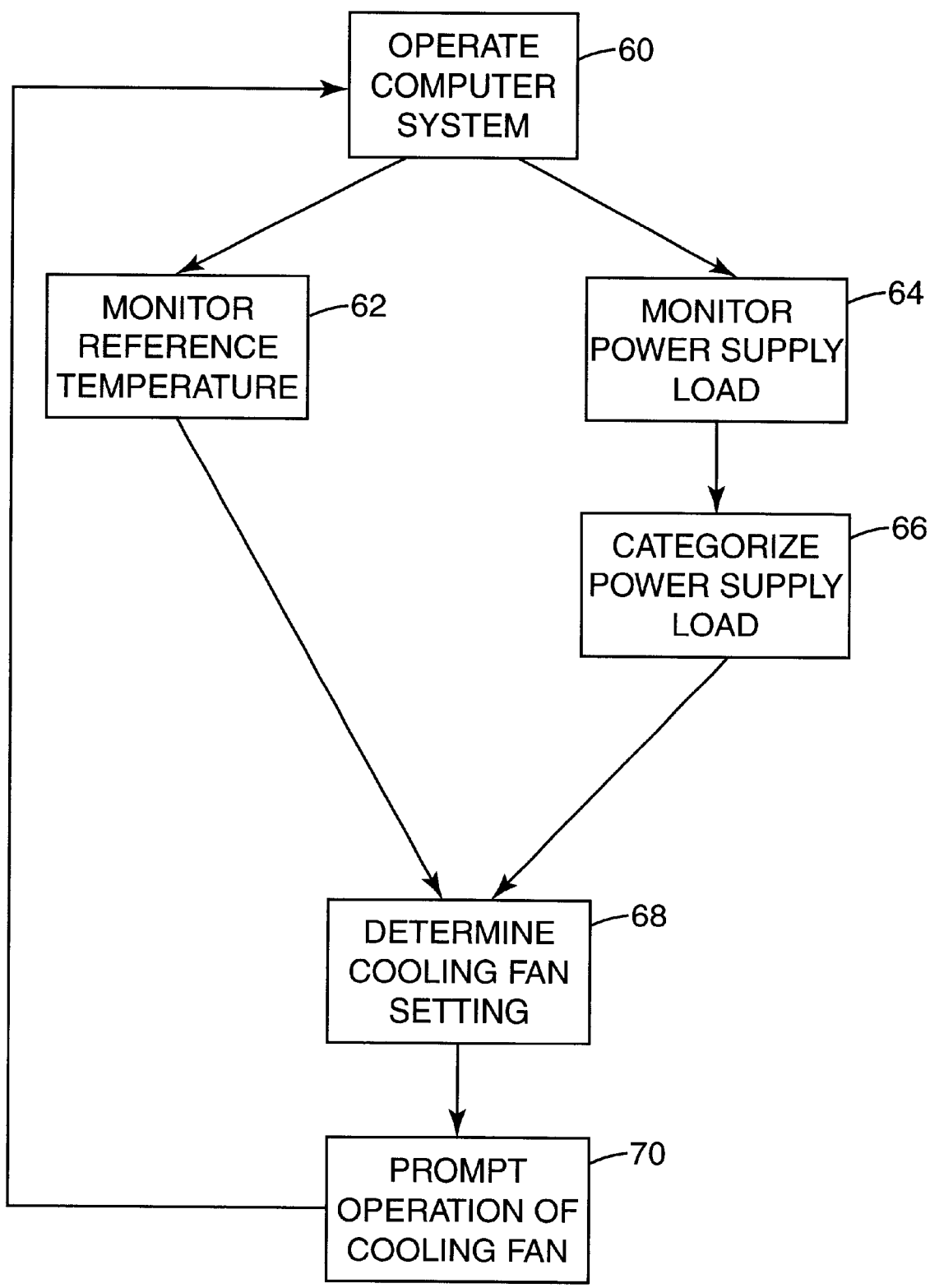
FIG. 3 is a flow diagram illustrating an alternative control method.

While the above-described methodology indicates distinct temperature and power supply load sensing operations, the parameters can instead be continually monitored. For example, with reference to the flow diagram shown in FIG. 3, an alternative method in accordance with the present invention begins at step 60 whereby the computer system 10 operates under normal conditions, as previously described. A temperature of the computer system 10 is continually monitored by the control device at step 62. In a preferred embodiment, the monitor temperature is an ambient air temperature at the chassis 12, as signaled by the temperature sensor 20. Simultaneously, at step 64, the load of the power supply unit 14 is continually monitored.

The power supply load is categorized relative to a maximum available power load of the power supply unit 14 at step 66. In effect, this step entails determining whether the power supply unit 14, and thus the computer system 10, is operating at or near full capacity (and thus at a high load) or at a lesser level. For example, in one preferred embodiment, the actual power supply load can be categorized as a "high" load if the power supply load is greater than 50% of the maximum available power load; or as a "low" load if the measured power supply load is equal to or less than 50% of the maximum available power load. Of course, any number of power supply load categories or percentage relative to maximum load can be implemented (e.g., "high" load at 66–100% of maximum available power load, "medium" load at 33–66% of maximum available power load, and "low" load at less than 33% of maximum available power load; etc.).

In particular, at step 68, the control device 22 utilizes the temperature and power load categorization to determine an appropriate fan setting. For example, the control device 22 can refer to a look-up table, utilize an appropriate formula, etc., to determine the fan setting. Regardless, the selected fan setting is a function of both temperature and the power load under which the computer system 10 is currently operating. Finally, at step 70, the control device 22 prompts the cooling fan 18 to operate at the selected fan setting. In one preferred embodiment, for example, the determined fan setting is a voltage to be applied to the motor 30. In this case, the control device 22 dictates that the selected voltage is applied.

Categorizing the actual power supply load relative to the maximum available power load allows the control device 22 to effectively account for a high-end computer operating at a low-end level when determining an appropriate cooling fan setting. As a further advantage, the system and method is effectively universal to any particular platform in that specific or absolute power supply load values are not utilized as set points or thresholds. That is to say, by controlling the cooling fan 18 as a function of actual power load relative to a maximum power load, the method and system of the present invention can be universally applied to a variety of different computer systems/platforms, regardless of internal components/modules. This represents a distinct advantage over prior art cooling fan control schemes that are platform specific.

As previously described, and in accordance with one preferred method the present invention, the control device 22 employs a look-up table to ascertain an appropriate fan setting based upon temperature and power supply load. In this regard, FIG. 4 provides one example of an acceptable look-up table. With this example, the fan setting ultimately selected by the control device 22 is in terms of a voltage applied to the motor 30 for a cooling fan 18 configured to operate at a voltage in the range of 6–12 volts. Further, the look-up table of FIG. 4 is premised on the measured load of the power supply unit being categorized as either "high" (i.e., 51–100% of maximum available power load) or "low" (i.e., less than 51% of maximum available power load). Finally, the reference temperature ranges reflect predetermined cooling capabilities of the fan 18 relative to an ambient air temperature within the chassis 12.

With the above in mind, the look-up table provides an appropriate fan setting (or voltage) for various reference temperatures for both of the high load and low load operating conditions. In this regard, the look-up table accounts for the fact that at lower power loads, the cooling fan 18 can sufficiently cool requisite components of the computer system 10 (such as the CPU 16) at higher ambient air temperatures as compared to a high power supply load with a similar fan setting (and thus air flow rate). For example, pursuant to the look-up table of FIG. 4, during low load operation, the cooling fan 18 can be maintained at the lowest level of 6 volts up to an ambient air temperature of 25° C., whereas the fan 18 will be operated at an 8 volt level at temperatures in excess of 22° C. during the high load operation. Were the actual power supply load not taken into account (as with traditional control schemes), the control device 22 would automatically trigger the cooling fan 18 to the 8 volt level as soon as the ambient air temperature exceeded 22° C. Of course, an increase in voltage (or fan speed) corresponds with an increase in acoustic noise. As such, the method of the present invention permits the cooling fan 18 to operate at a lower speed (and thus a lower acoustic noise level) without prematurely switching to a higher speed when the computer system 10 is operating at less than full capacity (via analysis of the load on the power supply unit 14).

It should be understood that the look-up table of FIG. 4 is merely exemplary. Actual acoustic performance and fan speed voltage settings are determined on an individual system design basis and will vary from platform to platform. For example, based upon an analysis of the computer system 10 components, the various temperature threshold values can be altered. Further, the look-up table can be more complex, and include fan settings for three or more power supply load categories of operation.

Alternatively, the look-up table can be simplified, for example, as shown in FIG. 5. The sensed temperature and power load are essentially categorized into one of four quadrants, with each quadrant representing a different fan setting. In this regard, the determination of whether the actual ambient temperature is "low" or "high", as well as whether the actual power load is "low" or "high", is system specific. Regardless, the fan setting dictated by the look-up table of FIG. 5 is a function of both temperature and power supply load. Thus, the look-up table represents a correlation of temperature and power supply load relative to appropriate cooling fan speeds.

The method and system of the present invention provides a marked improvement over previous designs. In particular, control over a computer system cooling fan is based upon both temperature and power supply load. As a result, the selected cooling fan speed is minimized, thereby minimizing resulting acoustic noise. This is particularly useful for high-end, server-type computer systems being utilized for low-end applications in "standard" office environments. A single cooling system is able to support both high-end applications and low-end applications without requiring two separate sets of hardware/fans otherwise needed to meet the more stringent acoustic signature targets for the low-end application.

Although the present invention has been described with reference to preferred embodiments, workers skilled in the art will recognize that changes can be made in form and detail without departing from the spirit and scope of the present invention.

What is claimed is:

1. A method of controlling a cooling fan of electronic equipment operating under normal conditions, the electrical equipment including a power supply unit, the method comprising:

sensing a power load of the power supply unit;

sensing a reference temperature of the electrical equipment; and determining a fan setting for the cooling fan based upon the sensed power load and the sensed reference temperature.

2. The method of claim 1, further comprising:

categorizing the sensed power load relative to a maximum available power load of the power supply unit.

3. The method of claim 2, wherein categorizing the sensed power load includes designating the sensed power load as a high load or a low load.

4. The method of claim 3, wherein the low load is characterized as being less than 51% of the maximum available power load.

5. The method of claim 1, further comprising:

establishing a look-up table including a plurality of fan settings each based upon a correlation of power supply load and reference temperature.

6. The method of claim 5, wherein determining a fan setting includes referring to the look-up table.

7. The method of claim 5, wherein the look-up table includes a first set of fan settings for different reference temperatures when the sensed power load is at a first level, and a second set of fan settings for different reference temperatures when the sensed power load is at a second level.

8. The method of claim 1, further comprising:

operating the cooling fan in accordance with the determined fan setting.

9. The method of claim 1, wherein sensing a power load includes sensing a current at the power supply unit.

10. The method of claim 1, wherein the reference air temperature is an ambient air temperature.

11. The method of claim 1, wherein sensing a power load includes monitoring the power load of the power supply unit, and further wherein sensing a reference temperature includes monitoring the reference temperature.

12. The method of claim 1, wherein the electrical equipment is a computer system.

13. A method of controlling a computer system operating under normal conditions, the computer system including a chassis maintaining a power supply unit, a temperature sensor, a central processing unit, and a cooling fan, the cooling fan rated to have a maximum operational speed, the method comprising:

sensing a power load of the power supply unit;

sensing a reference temperature of the computer system with the temperature sensor; and operating the cooling fan at less than the maximum operational speed when the sensed power load is less than a predetermined value and the sensed reference temperature is less than a predetermined value.

14. The method of claim 13, further comprising:

categorizing the sensed power load relative to a maximum available power load of the power supply unit.

15. The method of claim 14, wherein categorizing the sensed power load includes designating the sensed power load as a high load or a low load.

16. The method of claim 13, wherein operating the cooling fan includes determining a fan setting based upon the sensed power load and the sensed reference air temperature.

17. The method of claim 16, further comprising:

establishing a look-up table including a plurality of fan settings each based upon a correlation of power load and reference temperature.

18. A computer system comprising:

a chassis;

a central processing unit maintained within the chassis;

a cooling fan associated with the chassis;

a temperature sensor for sensing a reference temperature of the chassis;

a power supply unit coupled to the chassis for powering the central processing unit;

a load sensor for sensing a power load of the power supply unit; and a control device for controlling a speed of the cooling fan upon activation thereof by selecting a desired fan speed from a plurality of available speeds as a function of sensed ambient air temperature and of sensed power load during normal operation of the computer system.

19. The computer system of claim 18, wherein the control device includes a memory storing a look-up table having a plurality of fan settings each based on a correlation of power load and ambient air temperature.

20. The computer system of claim 18, wherein the control device is capable of categorizing the sensed power load relative to a maximum available power load of the power supply unit, the control device establishing a lower fan speed when the categorized power load is less than a predetermined value and the sensed ambient air temperature is less than a predetermined value.

* * * * *